United States Patent
Tsai et al.

(10) Patent No.: US 7,104,869 B2
(45) Date of Patent: Sep. 12, 2006

(54) BARRIER REMOVAL AT LOW POLISH PRESSURE

(75) Inventors: Stan Tsai, Fremont, CA (US); Rashid Mavliev, Santa Clara, CA (US); Lizhong Sun, San Jose, CA (US); Feng Q. Liu, Cupertino, CA (US); Liang-Yuh Chen, Foster City, CA (US); Ratson Morad, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 10/187,857

(22) Filed: Jun. 27, 2002

(65) Prior Publication Data

US 2003/0013387 A1   Jan. 16, 2003

Related U.S. Application Data

(60) Provisional application No. 60/353,421, filed on Feb. 1, 2002, provisional application No. 60/305,314, filed on Jul. 13, 2001.

(51) Int. Cl.
*B24B 1/00*     (2006.01)
*H01L 21/47*    (2006.01)

(52) U.S. Cl. .............................. 451/41; 451/57; 451/60; 451/287; 451/288; 451/447; 438/627; 438/626; 438/633; 438/643; 438/645

(58) Field of Classification Search .................. 451/41, 451/57, 60, 287, 288, 447; 438/627, 626, 438/633, 643, 645
See application file for complete search history.

(56) References Cited

U.S. PATENT DOCUMENTS

| | | | |
|---|---|---|---|
| 4,475,981 A * | 10/1984 | Rea ............................ 216/89 |
| 4,920,031 A | 4/1990 | Ohno et al. |
| 5,340,370 A | 8/1994 | Cadien et al. |
| 5,676,587 A | 10/1997 | Landers et al. |
| 5,693,563 A | 12/1997 | Teong |
| 5,735,963 A | 4/1998 | Obeng |
| 5,783,489 A | 7/1998 | Kaufman et al. |
| 5,842,910 A | 12/1998 | Krywanczyk et al. |
| 5,893,796 A | 4/1999 | Birang et al. |
| 5,897,426 A | 4/1999 | Somekh |
| 5,954,997 A | 9/1999 | Kaufman et al. |
| 5,981,454 A | 11/1999 | Small |

(Continued)

FOREIGN PATENT DOCUMENTS

EP     1 006 166 A1    6/2000

(Continued)

OTHER PUBLICATIONS

Written Opinion from PCT International Preliminary Examining Authority for US/02/00062, dated May 12, 2003.

(Continued)

*Primary Examiner*—Lee D. Wilson
*Assistant Examiner*—Shantese L. McDonald
(74) *Attorney, Agent, or Firm*—Patterson and Sheridan (57) ABSTRACT

The invention generally provides methods and compositions for planarizing a substrate surface having underlying dielectric materials. Aspects of the invention provide compositions and methods using a combination of low polishing pressures, polishing compositions, various polishing speeds, selective polishing pads, and selective polishing temperatures, for removing barrier materials by a chemical mechanical polishing technique with minimal residues and minimal seam damage. Aspects of the invention are achieved by employing a strategic multi-step process including sequential CMP at low polishing pressure to remove the deposited barrier materials.

24 Claims, 6 Drawing Sheets

U.S. PATENT DOCUMENTS

| | | | |
|---|---|---|---|
| 5,985,748 A | 11/1999 | Watts et al. | |
| 6,001,730 A * | 12/1999 | Farkas et al. | 438/627 |
| 6,068,879 A | 5/2000 | Pasch | |
| 6,074,949 A | 6/2000 | Schonauer et al. | |
| 6,083,840 A | 7/2000 | Mravic et al. | |
| 6,113,465 A | 9/2000 | Kim et al. | |
| 6,117,775 A | 9/2000 | Kondo et al. | |
| 6,117,783 A | 9/2000 | Small et al. | |
| 6,136,714 A | 10/2000 | Schutz | |
| 6,143,656 A | 11/2000 | Yang et al. | |
| 6,156,661 A | 12/2000 | Small | |
| 6,165,052 A | 12/2000 | Yu et al. | |
| 6,183,686 B1 | 2/2001 | Bardus et al. | |
| 6,184,141 B1 | 2/2001 | Avanzino et al. | |
| 6,217,416 B1 | 4/2001 | Kaufman et al. | |
| 6,218,290 B1 | 4/2001 | Schonauer et al. | |
| 6,235,633 B1 | 5/2001 | Jang | |
| 6,238,592 B1 | 5/2001 | Hardy et al. | |
| 6,258,721 B1 | 7/2001 | Li et al. | |
| 6,271,416 B1 | 8/2001 | Takagaki et al. | |
| 6,375,559 B1 | 4/2002 | James et al. | |
| 6,409,781 B1 | 6/2002 | Wojtczak et al. | |
| 6,432,823 B1 | 8/2002 | Huynh et al. | |
| 6,435,945 B1 | 8/2002 | Somekh | |
| 6,444,569 B1 | 9/2002 | Farkas et al. | |
| 6,447,371 B1 * | 9/2002 | Brusic Kaufman et al. | 451/36 |
| 6,475,069 B1 * | 11/2002 | Thomas et al. | 451/57 |
| 6,821,881 B1 | 11/2004 | Tsai et al. | |
| 2001/0013506 A1 | 8/2001 | Chamberlin et al. | |
| 2002/0090820 A1 | 7/2002 | Sun et al. | |
| 2003/0013387 A1 | 1/2003 | Tsai | |
| 2003/0022501 A1 | 1/2003 | Tsai | |
| 2003/0022801 A1 | 1/2003 | Sun et al. | |
| 2003/0029841 A1 | 2/2003 | Moon | |
| 2003/0036339 A1 | 2/2003 | Bonner | |
| 2003/0120927 A1 | 6/2003 | Kim | |

FOREIGN PATENT DOCUMENTS

| | | |
|---|---|---|
| EP | 1 011 131 | 6/2000 |
| EP | 1 085 067 | 3/2001 |
| EP | 1 093 161 A1 | 4/2001 |
| EP | 1 104 020 A1 | 5/2001 |
| EP | 1 116 762 A1 | 7/2001 |
| EP | 1 125 999 A1 | 8/2001 |
| FR | 1 603 558 | 6/1971 |
| JP | 2001-127018 | 5/2001 |
| JP | 2001-139937 | 5/2001 |
| KR | 2000011709 | 2/2000 |
| WO | 98/04646 | 2/1998 |
| WO | WO 98/04646 | 2/1998 |
| WO | 98/44061 | 8/1998 |
| WO | WO 98/36045 | 8/1998 |
| WO | 98/41671 | 9/1998 |
| WO | WO 98/41671 | 9/1998 |
| WO | WO 98/44061 | 10/1998 |
| WO | 98/49723 | 11/1998 |
| WO | WO 98/49723 | 11/1998 |
| WO | WO 99/46081 | 9/1999 |
| WO | 00/02238 | 1/2000 |
| WO | WO 00/00561 | 1/2000 |
| WO | 00/24842 | 5/2000 |
| WO | 00/30159 | 5/2000 |
| WO | WO 00/24842 | 5/2000 |
| WO | WO 00/30159 | 5/2000 |
| WO | 00/35627 | 6/2000 |
| WO | WO 00/35627 | 6/2000 |

OTHER PUBLICATIONS

PCT International Search Report from International Application No. PCT/US 02/ 22126, dated Mar. 5, 2003.

Partial Search Report (From PCT/ISA/206—Annex) for PCT/US02/22126, dated Dec. 6, 2002.

PCT International Search Report from International Application No. PCT/US01/50150, Dated Sep. 23, 2002.

International Search Report for PCT/US02/00062, dated Jul. 8, 2002.

U.S. Appl. No. 09/569,968 filed May 11, 2000 (Sun, et al.).

U.S. Appl. No. 09/968,863 filed Oct 27, 2000 (Tsai, et al.).

U.S. Appl. No. 09/968,864 fil d Oct 27, 2000 (Sun, et al.).

U.S. Appl. No. 09/755,717 filed Jan. 5, 2001 (Sun, et al.).

U.S. Appl. No. 10/193,810 filed Jul. 11, 2002 (Tsai, et al.).

U.S. Appl. No. 10/215,521 filed Aug. 8, 2002 (Sun, et al.).

PCT Written Opinion dated Feb. 24, 2005 for PCT/US02/22126.

PCT Written Opinion dated Feb. 28, 2005 for PCT/US01/50150.

PCT Partial Search Report dated Dec. 16, 2002 for PCT/US02/22126.

PCT Partial Search Report dated Mar. 5, 2003 for PCT/US02/22126.

US 5,985,755, 11/1999, Bajaj et al. (withdrawn)

* cited by examiner

BARRIER REMOVAL AT LOW POLISH PRESSURE

CROSS-REFERENCE TO RELATED APPLICATIONS

This application claims benefit of U.S. provisional patent application Ser. No. 60/305,314, entitled, "Dual Reducing Agents For Optimum Barrier Removal In Chemical Mechanical Polishing", filed Jul. 13, 2001, and U.S. provisional patent application Ser. No. 60/353,421, entitled, "Barrier Removal at Low Polish Pressure", filed Feb. 1, 2002. Each of the aforementioned related patent applications is herein incorporated by reference.

BACKGROUND OF THE INVENTION

1. Field of the Invention

Embodiments of the invention generally relate to planarization of semiconductor devices and to methods and compositions for material removal using polishing techniques.

2. Description of the Related Art

The semiconductor industry's focus to push semiconductor performance ever faster has recently shifted from front-end device performance to back-end interconnects. The multilevel interconnects that lie at the heart of semiconductor technology require precise processing of high aspect ratio features, such as vias, contacts, lines, and other interconnects. Reliable formation of these interconnects and reliable production of 0.13 micron and smaller features are important to the next generation of very large scale integration (VLSI) and ultra large-scale integration (ULSI) and to the continued effort to increase circuit density and quality of individual substrates and die.

Planarization is useful in damascene interconnect processes to remove excess deposited materials and to provide a planar surface for subsequent levels of metallization and processing. Planarization may also be used in removing undesired surface topography and surface defects, such as rough surfaces, agglomerated materials, crystal lattice damage, scratches, and contaminated materials. Chemical mechanical planarization, or chemical mechanical polishing (CMP), is a common technique used to planarize substrates. CMP utilizes two modes to planarize substrates. One is a chemical composition, typically a slurry, a polishing composition, or other fluid medium, for removal of materials from substrates, and the other is mechanical force, applying onto the substrate through a polishing pad, such as a conventional polishing pad or a fixed abrasive polishing pad.

As semiconductor device geometries shrink to 0.13 micron or below and the speed of the semiconductor devices decreases, and cross talk between wires and heat delay increases (RC delay). In order to minimize RC delay and to further improve the integration density of semiconductor devices on integrated circuits, the semiconductor industry is using conductive materials having low resistivity (1.7 $\mu\Omega$-cm for copper compared to 3.1 $\mu\Omega$-cm for aluminum) for conductors in feature definitions formed in insulating materials having low-k dielectric constants. Low-k is defined herein as having a value of dielectric constant, k, less than about 4.0, which is the k value for traditional $SiO_2$. For example, the dielectric constant for fluorinated silicate glass (FSG) is about 3.6 and that for carbon doped silicon oxide materials is less than about 3.

There are primarily two types of dielectric materials competing at the 0.13 micron or below technology node; carbon doped silicon oxides and spin-on-dielectric materials. Both of these materials create challenges for processing interconnects. Two challenges arise when using low-k dielectric materials: the mechanical hardness of low-k dielectric materials and adhesion at the interface of the low-k material and the adjacent materials. Furthermore, there is a need for a protective layer formed on top of low-k materials to prevent exposure of the low-k material to moisture and to provide good adhesion to the underlying low-k materials. Such undesirable structural and adhesion failures cause damage or defects as a result of aggressive processing and require the shear force or frictional force in a CMP process to be small. Shear force or frictional force is approximately proportional to down load force. Therefore, the requirements further imply that down load force, typically measured in pounds, and polishing pressure, which represents the amount of the down load force divided by the polishing area and typically measured in pounds per square inch (psi), during processing has to be small. Integration approaches for low-k materials must comprehend these basic integration changes, and so an emphasis on characterization techniques for mechanical properties, chemical interactions and dielectric stability becomes important.

Beyond 0.13 micron low-k technology, integration issues are even more difficult. It is believed that future k values will have to be 2.2 or less. One of the pathways to achieve lower k values is to introduce pores into silicon oxide based materials to form porous polymers. The introduction of porosity can result in substantially reduced mechanical integrity of the low-k materials and affect processing performance.

In addition, copper diffuses into surrounding materials, such as the low k dielectric materials. Therefore, barrier materials are deposited in feature definitions formed in the low-k dielectric materials prior to copper deposition to reduce or minimize copper diffusion into the surrounding materials.

Typically, vertical and horizontal interconnects are formed by a damascene or dual damascene process. In the damascene method, one or more dielectric materials, such as the low k dielectric materials, are deposited and pattern etched to form the vertical interconnects, e.g., vias, and horizontal interconnects, e.g., lines. Conductive materials, such as copper-containing materials, and other materials, such as barrier materials used to prevent diffusion of copper-containing materials into the surrounding low k dielectric, are then inlaid into the etched pattern. Any excess copper-containing material and any excess barrier material external to the etched pattern, such as on the field of the substrate, are then removed.

After material deposition by the damascene or dual damascene method, the uppermost substrate surface may become non-planar and require planarization. Conventionally, in polishing substrates having features, such as a dual damascene feature formed by the deposition of a barrier layer in an aperture and a conductive layer, such as copper, disposed on the barrier layer, the conductive layer is polished to the barrier layer, and then the barrier layer is polished to the underlying dielectric layer to form the feature. In most conventional applications, erosion and dishing are typically encountered. As used throughout this disclosure, the term "erosion" denotes a difference in height between the dielectric materials in the open field and the dielectric materials within the dense array. The term "dishing" denotes a difference in height between the highest point of the dielectric materials and the center of the copper features.

Erosion of the low-k materials typically occurs within the dense array and is believed to be attributed in part to an increase in pressure due to the presence of recesses and, hence, less copper, generating a pressure differential between the dense array and the open field. Consequently, the removal rate within the dense array is greater than the removal rate in the open field. Additionally, increasing the polishing pressure and increasing the polishing time to ensure copper layer removal may result in overpolishing the barrier layer and formation of topographical defects, such as concavities or depressions, referred to as dishing. Dishing further results in a non-planar surface that impairs the ability to print high-resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

However, polishing substrates at reduced pressures often results in reduced polishing removal rates and reduced substrate throughput. Barrier materials, such as tantalum (Ta) and tantalum nitride (TaN), are known to be chemically inert and difficult to polish at low pressure, resulting in large amounts of problematic barrier residues even after polishing by polishing compositions with high selectivity to barrier materials. Also other low adhesive cap materials, hard masks, and/or anti-reflective coating materials on top of the underlying dielectric materials are now exposed on the substrate surface. Overpolishing of the barrier residues and these protective materials by strong mechanical abrasion means metal loss, seam damage or device defect. On the other hand, low polishing pressure processes may be unable to sufficiently remove all of the desired barrier materials from a substrate surface. Such barrier materials or residues retained on the substrate surface can detrimentally affect device formation, such as creating short-circuits within or between devices, reducing device yields, reducing substrate throughput, and detrimentally affecting the polishing quality of the substrate surface. On the other hand, polishing at low pressure and high velocity (e.g., 0.5 psi/600 rpm) is commonly observed to be ineffective due to the hydroplaning effect where the removal is effectively zero.

Therefore, there exists a need for low-k compatible methods and related CMP compositions that use low shear force/down load force to prevent low-k dielectric damage and facilitate the effective removal of barrier materials and residues at a high removal rate.

SUMMARY OF THE INVENTION

Embodiments of the invention generally provide methods and compositions for planarizing a substrate surface using low down force. Aspects of the invention provide compositions and methods using a combination of polishing conditions including polishing pressures, polishing compositions, various polishing speeds, selective polishing pads, and selective polishing temperatures, for removing barrier materials by a chemical mechanical polishing technique with minimal residues and minimal seam damage. Aspects of the invention are achieved by employing a strategic multi-step process comprising sequential CMP at low polish pressure to remove the deposited barrier materials.

In one embodiment, a method of chemical mechanical polishing a substrate having dielectric materials, barrier materials, and metal conductive materials disposed thereon is provided. The method includes polishing the substrate on a polishing platen at a first polishing pressure and a first platen speed in the presence of a first composition applied to a polishing pad and then polishing the substrate on a polishing platen at a second polishing pressure and a second platen speed in the presence of a second composition applied to a polishing pad. The first polishing conditions are used to remove the barrier materials and the second polishing conditions are used to remove any residual barrier materials. In another embodiment, the second polishing conditions are used to also remove at least some portion of cap materials, hard masks, and/or anti-reflective coating materials disposed on top of the dielectric materials.

In another embodiment, the first composition includes up to about 2 wt. % of at least one reducing agent selected from the group of bicarboxylic acids, tricarboxylic acids, and combinations thereof, up to about 2 wt. % of at least one reducing agent selected from the group of glucose, hydroxylamine, and combinations thereof, up to about 1 wt. % of corrosion inhibitors, up to about 10 wt. % of abrasive particles, deionized water, and a pH of about 7 or less. The second composition includes up to about 30 wt. % of abrasive particles, up to about 1 wt. % of corrosion inhibitors, at least one pH buffering agent, deionized water, and a pH of between about 3 and about 12.

In another embodiment, a method of chemical mechanical polishing a substrate having dielectric materials with a dielectric constant of 3.5 or less includes polishing the substrate surface by a first and second chemical mechanical polishing processes. The first and second chemical mechanical polishing processes provide a decreased polishing pressure of about 2 psi or less, an increased average platen surface speed of about 65 centimeters per second (cps) or higher, preferably about 260 cps or higher, and/or a polishing temperature of about 55° C. or higher.

In one aspect, the invention provides the use of selective polishing pads to be compatible with an increased average platen surface speed of about 195 cps or higher, and polishing the substrate surface with low down load force and thus a decreased polishing pressure of 2 psi or less.

In another aspect, the invention provides polishing the substrate surface with low down load force to remove a barrier layer disposed thereon at a first removal rate and any residual barrier material at a second removal rate. With various speed and pressure combinations, the first removal rate can be increased to about 200 Å/min or higher, such as about 1000 Å/min or higher and the second removal rate can be increased to about 200 Å/min or higher.

In another aspect, the invention provides a first polishing composition for removing a bulk portion of the barrier layer at a ratio of barrier materials to copper materials at about 5:1 or higher, preferably about 20:1 or higher, by a polishing technique. The invention provides a second polishing composition to the substrate for removing any residual barrier material from the substrate surface at a ratio of barrier materials to copper materials to dielectric materials between about 1:1:1 and about 1:1:10. The second polishing composition optionally provides to remove at least some portion of cap materials, hard masks, and/or anti-reflective coating materials on top of low-k materials.

BRIEF DESCRIPTION OF THE DRAWINGS

So that the manner in which the features of the invention described herein are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the invention are described herein with reference to methods of planarizing a barrier layer having underlying low-k dielectric materials by CMP at low polishing pressures with minimal residues of excess conductive materials and significantly reduced erosion, dishing and defects.

The words and phrases used herein should be given their ordinary and customary meaning in the art unless otherwise further defined. Chemical mechanical planarization, or chemical mechanical polishing (CMP) is the application of chemical activity, mechanical activity, or a combination of both chemical and mechanical activity to remove material from a substrate surface. In some systems, a substrate is polished on a pad in the presence of a polishing fluid, also known as a slurry, which may contain reactive chemicals and abrasives that remove or polish materials off the surface of the substrates being polished. The interaction among a polishing pad, the chemically reactive polishing fluid with or without abrasives, and a substrate surface imparts a combination of chemical and mechanical forces to the substrate which planarizes the substrate surface resulting in controlled polishing of the exposed materials. In a fixed-abrasive system, a polishing pad called a fixed abrasive pad is used which includes abrasives and does not necessary require abrasive particles within the slurry, although additional abrasives may be used.

The bulk portion of a layer or material is material deposited on a substrate in an amount more than sufficient to substantially fill features formed on the substrate surface and completely cover the substrate surface. Residual material is any excess material remaining on the field of a substrate after one or more polishing steps. A field of a substrate is the area between features formed on a substrate.

Cap material is material deposited on top of dielectric materials to protect the dielectric materials from exposure to etchants or moisture during subsequent processing steps. Hard mask is material deposited on top of dielectric materials to assist the etching of the dielectric materials and improve the resolution of trench/via definitions. Anti-reflective coating material is material deposited on top of the dielectric materials before photoresist to improve the resolution of trench/via photolithographic patterning. Typical protective materials such as cap materials, hard masks, and anti-reflective coating materials include silicon oxynitride ($SiO_xN_y$), silicon carbide (SiC), silicon oxycarbide ($SiO_xC_y$), and combinations thereof. These materials typically are deposited on top of the dielectric materials either alone or in combination, and have a thickness between about 100 Å and about 800 Å.

Selectivity for a CMP process is a ratio of removal rates of two different materials under the same polishing conditions. Removal rate (RR) for a CMP process is the average amount of material removed in a given time. Removal rate is generally represented as $RR=K_p \times P \times V$, the Preston equation, where $K_p$ is the Preston coefficient, P is the polishing pressure, and V is the velocity of the pad relative to the workpiece. Therefore, the removal rate is directly proportional to both the velocity of the pad and the pressure. Furthermore, the polishing removal rate is zero in the absence of either pressure or velocity. The Preston equation is reasonably followed for most CMP processes, and $K_p$ is dependent on process variables, such as slurry composition and pad properties.

Down load force or down force, typically measured in pounds, is the force being loaded directly or indirectly on a substrate.

As used throughout this disclosure, the phrase "copper-containing material", "copper" and the symbol Cu are intended to encompass high purity elemental copper as well as doped copper and copper-based alloys, e.g., doped copper and copper-based alloys containing at least about 80 wt. % copper.

Chemical Mechanical Polishing Process

Embodiments of the invention include a multi-step process for removing materials from a substrate including polishing the substrate surface using a first polishing composition at a first removal rate with a first down load force (thus, a first polishing pressure) to remove most of a bulk portion of a barrier layer and polishing the substrate surface using a second polishing composition at a second removal rate with a second down load force (thus, a second polishing pressure) to remove any residual material as well as at least some portion of cap materials, hard masks, and/or anti-reflective materials deposited either alone or in combination on top of the underlying dielectric materials from the substrate surface.

In one aspect, the process includes polishing the surface of a substrate having underlying dielectric materials, such as low-k materials, at a low polishing pressure by applying a low down load force to the substrate surface. The method for planarizing such a substrate surface includes first polishing conditions to selectively remove the bulk materials, such as bulk barrier materials, and second polishing conditions to non-selectively remove any residual barrier material. Additionally, the second polishing technique may remove at least some portion of cap materials, hard masks, and/or anti-reflective coating materials deposited either alone or in combination on top of the underlying dielectric materials from the substrate surface.

In one embodiment, the method includes polishing the substrate surface at an average platen speed of about 65 cps or higher, preferably about 260 cps or higher, which is relatively about 200 revolutions per minute (rpm) or higher for a 20 inch platen. The method is compatible with low down load force and thus a polishing pressure of about 2 psi or less, preferably about 1 psi or less.

In another embodiment, the method includes choosing low down-load-force compatible polishing pads to reduce hydroplaning effect. In another embodiment, the method further includes polishing at high temperature.

In another embodiment, the invention provides a first composition adapted for selective removal of a barrier material, such as tantalum and tantalum nitride, and a second composition adapted for non-selective removal of any barrier material residue, such as tantalum residue and tantalum nitride residue, as well as at least some portion of cap materials, hard masks, and/or anti-reflective coating materials, deposited either alone or in combination on top of the underlying dielectric materials.

In another embodiment, the invention provides a method of planarizing a substrate surface including supplying a first polishing composition to remove substantially a bulk portion of the barrier layer at a ratio of barrier materials to copper materials to dielectric materials of about 5:1:1 or higher, such as about 20:1:1 or higher, by a first polishing technique and supplying another one or more polishing compositions to remove residual barrier materials as well as at least some portion of cap materials, hard masks, and/or anti-reflective coating materials, deposited either alone or in combination on top of the underlying dielectric materials, at a ratio of barrier materials to copper materials to dielectric materials between about 1:1:1 to about 1:1:10 by a second chemical mechanical polishing technique.

Figure 1:
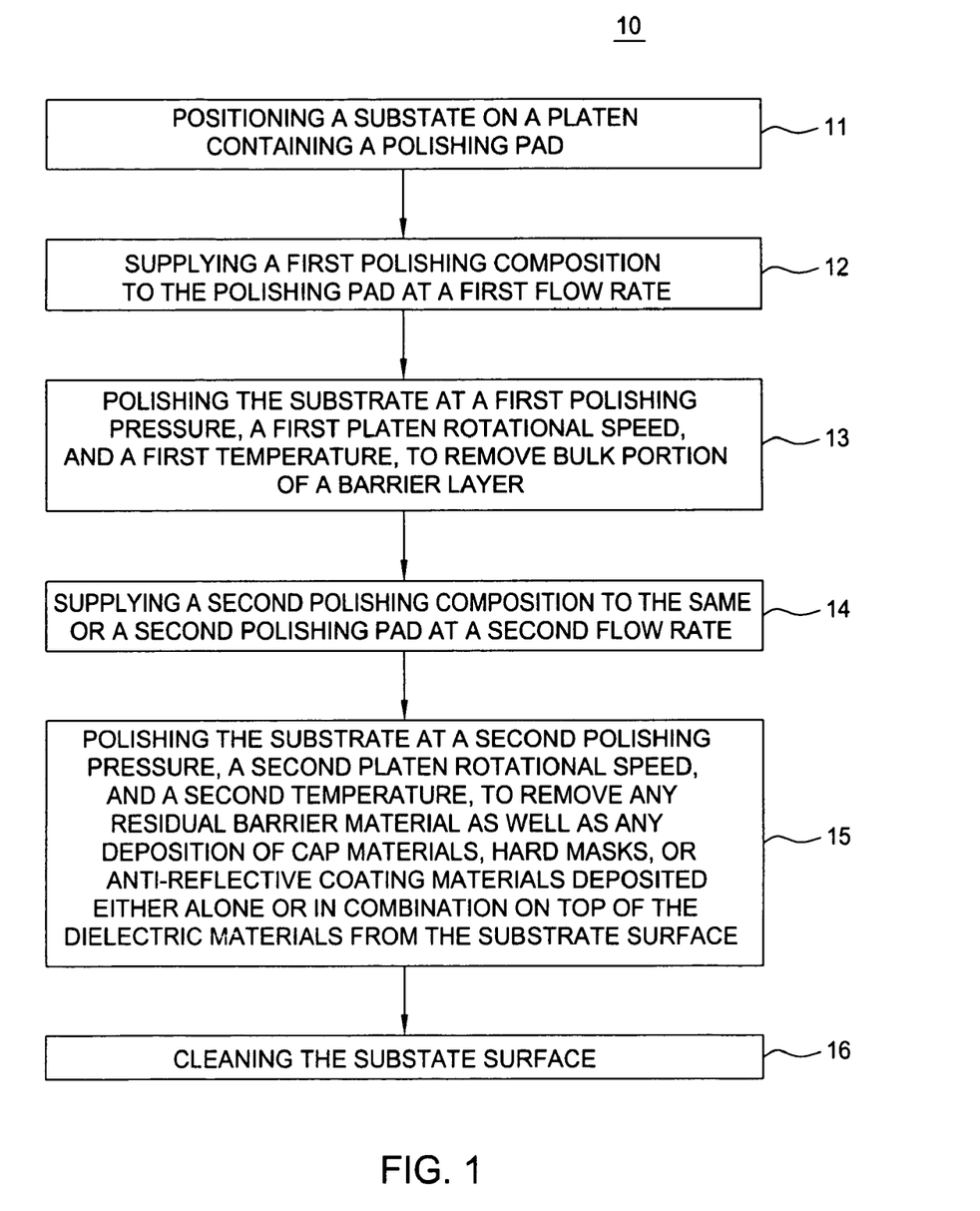
FIG. 1 is a flow chart illustrating the processing steps according to one embodiment of the invention.

FIG. 1 illustrates one embodiment of a process 10 to remove materials using a multi-step planarization process. At step 11, a substrate is positioned on a platen containing a low-pressure compatible polishing pad and, at step 12, a first polishing composition is supplied to the polishing pad at a first flow rate. A bulk portion of a barrier layer is then removed from the surface of the substrate at Step 13 by polishing the substrate at a first polishing pressure, a first platen speed, and a first temperature. A second polishing composition is then supplied at a second flow rate at Step 14. The substrate is then polished at a second polishing pressure, a second platen speed, and a second temperature, to remove residual barrier materials as well as at least some portion of cap materials, hard masks, and/or anti-reflective coating materials, deposited either alone or in combination on top of the dielectric materials at Step 15. Finally, the substrate surface is cleaned at Step 16.

Step 11 includes positioning a substrate on a platen in contact with a polishing pad. At Step 12, the substrate and the polishing pad move relative to one another with a first polishing composition distributed at a first flow rate to effect chemical and mechanical activity on the substrate. A conventional polishing pad and a first polishing composition with a low abrasive or abrasive-free chemical agent, which are compatible with low-pressure, high velocity polishing of a barrier layer are used. An example of a suitable conventional polishing pad is a Politex pad from Rodel Inc. of Phoenix. It is contemplated that other commercial pads that show reduced tendency of hydroplaning effect at low polish pressure can be used to great advantage. An example of a suitable polishing composition is disclosed in U.S. Patent Application No. 60/305,314, entitled, "Dual Reduced Agents For Optimum Barrier Removal In Chemical Mechanical Polishing", filed on Jul. 13, 2001, which is incorporated by reference herein.

Step 12 includes supplying the first polishing composition to the polishing pad at a flow rate of about 100 ml/min or greater from a storage container disposed near the CMP apparatus; exposing the substrate and the polishing pad to the first polishing composition; and contacting the substrate with the pad for a period of time sufficient to remove at least a portion of the bulk barrier layer disposed on the substrate. For example, a flow rate of between about 150 ml/min and about 250 ml/min may be used and the polishing pad may be exposed to the first polishing composition for between about 20 seconds and about 180 seconds, but volume and time may vary depending upon the material being removed, the concentration of the components of the first polishing composition, and the amount or thickness of bulk barrier layer on the substrate.

The substrate is polished at Step 13 using a polishing pressure of about 2 psi or less, such as between about 0.1 psi and about 1.5 psi, applied between the substrate and the polishing pad during the polishing process. A low polishing pressure between about 0.5 psi and about 0.8 psi is preferably used.

In one embodiment, Step 13 includes polishing the substrate at room temperature and an average platen surface speed of about 260 cps or greater, which is about 200 rpm or higher for a 20 inch platen, such as between about 260 cps and about 975 cps (about 200 rpm and about 750 rpm) depending on the pad materials used. The platen is typically rotated at a speed between about 390 cps and about 780 cps (about 300 rpm and about 600 rpm) and the substrate, disposed in a carrier head system, is rotated at a speed between about 195 cps and about 650 cps (about 150 rpm and about 500 rpm). The bulk barrier layer is thus removed at a rate of about 200 Å/min or higher, preferably about 500 Å/min or higher, more preferably about 1000 Å/min.

Alternatively, at higher temperatures, lower platen and substrate speeds can be used. Step 13 may include a polishing temperature of about 50° C. or higher, such as between about 60° C. to about 80° C., and a lower average platen speed, such as between about 26 cps and about 650 cps (about 20 rpm and about 500 rpm). A polishing pressure of about 2 psi or less may be used in order to encompass the same high removal rate at the higher polishing temperature. At a polishing temperature of about 50° C. or higher, the platen is rotated at a speed between about 65 cps and about 260 cps (about 50 rpm and about 200 rpm) and the substrate, disposed in a carrier head system, is rotated at a speed between about 130 cps and about 455 cps (about 100 rpm and about 350 rpm), such as between about 195 cps and about 390 cps (about 150 rpm and about 300 rpm). An increased polishing temperature further enhances polishing removal rate, thus improving process throughput, and also easing engineering efforts to design a high-speed platen. During normal CMP processes, the temperature of the polishing pad reaches about 40° C. The temperature can be raised to between about 60° C. and about 80° C. by increasing the temperature of the platen or the slurry.

Step 14 includes polishing the substrate with a second polishing composition containing abrasive or abrasive-free agents with the same conventional polishing pad as at Step 11, a fixed abrasive polishing pad, or a different conventional polishing pad. The second polishing composition is delivered to the polishing pad at a second flow rate. For example, a flow rate of about 100 ml/min or greater can be used. Typically, a flow rate of between about 100 ml/min and about 300 ml/min is used. At Step 14, the substrate is polished on the same platen as at Step 11 or on a second platen containing the same type or a different type of polishing pad. The platens may include rotating platens, stationary platens, linear platens, and combinations thereof.

At Step 15, the polishing pad may be rotated to provide an average platen speed of about 130 cps or greater (about 100 rpm or greater), such as between about 195 cps and about 975 cps (about 150 rpm and about 750 rpm) and a polishing pressure of about 2 psi or less, such as between about 0.1 psi and about 1.5 psi. The substrate may also be rotated at a speed between about 195 cps and about 650 cps (about 150 rpm and about 500 rpm), such as between about 390 cps and about 650 cps (about 300 rpm and about 500 rpm). Depending on the target removal rate for rapid throughput, the first platen speed at Step 13 can be higher than the second platen speed at Step 15 to encompass high removal rate but it is not absolutely necessary since the two polishing compositions are different.

For example, when an abrasive-containing second polishing composition is used, a polishing pressure of about 1.5 psi or less, and a polishing speed of about 65 cps or higher (about 50 rpm or higher) are employed. An example of polishing parameters for an abrasive-containing second polishing composition includes polishing at a platen speed of about 142 cps (109 rpm) and a pressure of about 0.5 psi.

Alternatively, when an abrasive-free second polishing composition is used, a polishing pressure of about 1.5 psi or less and a polishing speed of about 195 cps or higher (about 150 rpm or higher) are employed. Another example of polishing parameters for an abrasive-free second polishing composition includes polishing at a platen speed of about 390 cps (300 rpm) and about 0.5 psi.

Step 15 includes exposing the substrate and the second polishing pad to a second polishing composition for a period of time sufficient to remove residual barrier materials, cap materials, hard masks, and/or anti-reflective coating materials, disposed thereon at a removal rate up to about 50 Å/min or higher, such as between about 80 Å/min and about 250 Å/min, and provides for non-selective light buffing to remove a small portion of the dielectric materials and at least some portion of the protective materials as well as overpolishing of the substrate surface to further remove defects formed thereon. For example, the polishing pad may be exposed to the second polishing composition for about 10 seconds to about 180 seconds, such as about 20 seconds, but may vary depending upon the materials being removed, the concentration of the components of the second polishing composition, and the amount or thickness of residual contaminants on the substrate.

Alternatively, Step 15 may be performed at a temperature of 50° C. or higher, such as between about 60° C. and about 80° C., where, accordingly, a lower platen speed, such as of between about 26 cps and about 400 cps (about 20 rpm and about 500 rpm) is used. For example, a platen speed of between about 26 cps and about 400 cps (about 50 rpm and about 200 rpm) and a carrier head speed of between about 130 cps and about 455 cps (about 100 rpm and about 350 rpm), such as between about 195 cps and about 390 cps (about 150 rpm and about 300 rpm) can be employed.

All or some of the steps in FIG. 1 may be performed as part of one continuous operation, two or more distinct operations, on the same CMP apparatus, or on more than one apparatus. While the process described herein illustrates polishing on one platen, the invention contemplates polishing the substrate on an apparatus having one or more polishing platens such that the steps may be performed on the same platen, or portions of some processing steps may be performed on different platens. In addition, the second polishing technique may be performed as combination of several steps for removing different residual materials on top of the dielectric materials.

The processing parameters of the first and second polishing techniques may be modified based upon the use of either an abrasive-containing or abrasive-free second polishing composition. It has been observed that the two-step polishing processes described herein reduce dishing of the copper-containing material, remove the presence of residual barrier materials, reduce the formation of undesirable materials, by-products, and defects, remove at least some portion of the cap materials, hard masks, and/or anti-reflective coating materials on top of low-k dielectric, reduce erosion of the underlying low-k dielectric materials, reduce metal loss, and improve planarization of the substrate surface.

At Step 16, the substrate is rinsed following removal of the barrier materials to remove surface defects and particles adhering to the substrate surface. Additionally, the substrate may be transferred to a cleaning module or subjected to an in situ cleaning process to remove surface defects, such as oxides that form on the substrate surface. Optionally, a cleaning solution may be applied to each of the polishing pads during or following each of the polishing steps to remove particulate matter and reagents as well as help minimize metal residues remaining on the polishing pads and defects formed on the substrate surface. One example of a suitable cleaning solution is Electra Clean™, which is commercially available from Applied Materials, Inc., of Santa Clara, Calif.

In one embodiment of the invention, the first polishing conditions have a high selectivity to barrier materials and provides minimum copper dishing and dielectric erosion. The second polishing conditions have a low selectivity to barrier materials, removing residual barrier material and providing control of metal loss, dielectric erosion, and copper dishing. Typically, the first removal rate is a relatively high removal rate for rapid throughput, e.g., a removal rate of about 500 Å/min or higher, and the second removal rate is a removal rate for buffing in a short period of time, usually in seconds, e.g., a removal rate greater than about 200 Å/min.

The multi-step polishing sequence described herein can be used to polish features formed by damascene processes. Advantageously, processes provided herein can be useful in processes where low dielectric constant (low-k) materials, i.e. dielectric constants of about 3.5 or less, are utilized. Low-k materials may include fluoro-silicon glass (FSG), porous polymers, such as polymides and carbon-containing silicon oxides, such as Black Diamond™, available from Applied Materials, Inc. of Santa Clara, Calif. Processes provided herein also can be used with conventional dielectric materials applications. For example, the substrate can be doped monocrystalline silicon or gallium-arsenide. The dielectric layers also can include any of various dielectric materials known or unknown that may be employed in the manufacture of semiconductor devices. For example, dielectric materials, such as silicon dioxide, phosphorus-silicate-glass (PSG), boron silicate glass (BSG), boron doped phosphorus-silicate-glass (BPSG), and silicon dioxide derived from tetraethyl orthosilicate (TEOS) or silane by plasma enhanced chemical vapor deposition (PECVD) can be employed. The features are formed in dielectric materials by conventional photolithographic and etching techniques.

In addition, the CMP compositions and processes described herein can be employed to polish and planarize metal layers, including various metal conductive layers and barrier layers, and advantageously can be employed to polish and planarize metal conductive materials with low resistivity (less than 3.0 μΩ cm), such as copper, copper alloys, doped copper, and combinations thereof, for example, and the barrier materials compatible with such low resistivity metals, such as tantalum (Ta), tantalum nitride (TaN), for example. It is contemplated that other metals such as aluminum, doped aluminum, nickel, doped nickel, tungsten, and combinations thereof may be polished and planarized using aspects of the invention. It is further contemplated that other materials, including tantalum silicon nitride (TaSiN), titanium nitride (TiN), titanium tungsten (TiW), titanium tungsten nitride (TiWN), titanium silicon nitride (TiSiN), tungsten (W), tungsten nitride (WN), tungsten silicon nitride (WSiN), and silicon nitride (SiN), palladium (Pd), platinum (Pt), nickel (Ni), cobalt (Co) and combinations thereof, used for forming barrier materials with conductive materials, such as copper and copper alloys, can be employed as well.

Aspects of the invention provide compositions and methods for planarizing a substrate surface resulting in reduced or minimal barrier material residue remaining after such polishing process. The introduction of high speed (about 200 rpm or greater) versus conventional speed (about 180 rpm or less) greatly improves planarization capability, especially on substrates with high overfill, and allows high removal rates at very low polishing pressure. The low down load force planarization sequence also efficiently avoids film delamination when low-k materials are used as interlayer dielectric (ILD) layers.

Additionally, while the processing parameters are generally described for polishing 300 mm substrates, the invention contemplates modified processing parameters to satisfy the requirements for polishing substrates of different sizes, such as 200 mm substrates. The process described and the following composition and apparatus descriptions are illustrative and should not be construed or interpreted as limiting the scope of the invention.

Barrier Material Removal Compositions

One embodiment of the first barrier material removal composition includes at least one reducing agent selected from the group of bicarboxylic acids, tricarboxylic acids, and combinations thereof, at least one reducing agent selected from the group of glucose, hydroxylamine, and combinations thereof, and deionized water, wherein the composition has a pH of about 7 or less.

The bicarboxylic acids or tricarboxylic acids may be present at a concentration of about 2 wt. % or less, such as a concentration of between about 0.01 wt. % and about 0.5 wt. %. A concentration of about 0.2 wt. % of bicarboxylic acids or tricarboxylic acids has been observed to be sufficient in the first polishing composition. An example includes but is not limited to oxalic acid.

The reducing agent, such as hydroxylamine, glucose, or combinations thereof, may be present in the first composition at a concentration of about 2 wt. % or less, such as a concentration of between about 0.01 wt. % and about 0.5 wt. %. A concentration of about 0.2 wt. % of the reducing agent has been observed to be sufficient in the first polishing composition.

The first composition may further include one or more surfactants or abrasive particles, such as, but not limited to, silica ($SiO_2$), alumina ($Al_2O_3$), titania ($TiO_2$), ceria ($CiO_2$), and combinations thereof, having a low concentration of about 10 wt. % or less, such as between about 0.5 and about 2 wt. %. A first composition having an abrasive concentration between 0.5 wt. % and about 1 wt. % has been found sufficient.

The first composition may also include, for example, a buffer agent for pH stability, at least one agent for adjusting pH to provide a pH in which the reducing agents are chemically active. The buffer agent may be at a concentration of between about 0.1 wt. % and about 8 wt. % to provide for a relatively stable pH environment in the range in which the reducing agent is active. The buffer agent includes, but is not limited to, an alkali metal bicarbonate or tetraborate-tetrahydrate salt, but preferably is potassium bicarbonate or potassium tetraborate-tetrahydrate. The amount of buffering agent used may vary, depending on the pH of the solution as well as the variable ability of the buffering agent to buffer the polishing composition. The agent for adjusting pH may be any organic or inorganic bases and acids, such as potassium hydroxide (KOH), acetic acid, phosphoric acid, or nitric acid, present at a concentration sufficient to provide the composition with a selected pH of about 7 or less.

In addition, the first polishing composition may include one or more corrosion inhibitors to prevent corrosion of the conductive material in the features. In one embodiment, the corrosion inhibitors may include one or more organic compounds containing an azole group, such as mercaptobenzotriazole, 5-methyl-1-benzotriazole, and benzotriazole (BTA), for example. The corrosion inhibitor may be present at a concentration of about 2 wt. % or less, such as between about 0.02 wt. % and about 0.4 wt. %.

Further, the first polishing composition may include a metal chelating agent, such as ethylenedinitrilotetraacetic acid (EDTA) among others.

An example of a first composition as described herein includes about 0.5 wt. % of oxalic acid, about 0.4 wt. % of hydroxylamine, about 0.2 wt. % of a surfactant, about 1 wt. % of silica abrasive particles, deionized water, and a pH of about 6.

Another example of a first composition as described herein includes about 0.2 wt. % oxalic acid, between about 0.15 wt. % and about 0.2 wt. % of hydroxylamine, about 0.2 wt. % of BTA, about 1 wt. % of silica abrasive particles, deionized water, and a pH of about 6.

Suitable first compositions for selective barrier removal are also disclosed in co-pending U.S. Patent Application Ser. No. 60/305,314, filed on Jul. 13, 2001, U.S. patent application Ser. No. 09/698,863, filed on Oct. 27, 2000, and U.S. patent application Ser. No. 09/569,968, filed on May 11, 2000, all of which are incorporated herein by reference to the extent consistent with the invention.

The first composition described herein may remove barrier materials at a removal rate ratio, i.e., removal rate of barrier material versus removal rate of dielectric materials, of about 5:1 or greater, such as up to about 50:1 or greater. For example, one embodiment of the first composition described herein removes barrier materials at a removal rate of between about 300 Å/min and about 2,000 Å/min with a dielectric removal rate of about 50 Å/min.

One embodiment of the second barrier material removal composition includes a buffing composition generally used for removing dielectric oxide materials. The second composition may have an abrasive particle concentration of about 35 wt. % or less, such as a concentration of about 15 wt. % or less to be employed together with a conventional polishing pad. Practically, the concentration of abrasive particles is adjusted according to the amount of cap materials, and the hard masks, anti-reflective coating materials or other materials that may be deposited on top of the low-k dielectric materials that need to be removed. In some cases, small amounts of cap materials, hard masks, and/or anti-reflective coating materials are intentionally left to protect the underlying low-k materials, and only residual barrier materials and some of the above low-k protective materials are removed. One example of a second composition having abrasive particles includes a colloidal suspension of silica (silicon oxide) particles, with an average size of about 50 nm, at a concentration of up to about 30 wt. %. Abrasive components which may be used in the second composition include but are not limited to alumina, zirconium oxide, titanium oxide, cerium oxide, or any other abrasives known in the art. In an alternative embodiment, the second composition may not include any abrasive particles and a fixed abrasive polishing pad is employed.

The second composition may further include a pH-adjusting agent and/or pH-buffering agent present in an amount sufficient to adjust the pH of the second composition to a range of about 3 to about 12. The pH-adjusting agent may include up to about 1 vol % of the composition. The pH-adjusting agent includes any of various non-chelating bases, such as, but not limited to, potassium hydroxide (KOH) or inorganic and/or organic non-chelating acids, such as phosphoric acid, acetic acid, and oxalic acid.

The pH-buffering agent may be any alkali metal salt, such as an alkali metal bicarbonate or tetraborate-tetrahydrate salt present at a concentration up to about 1 vol % of the composition. Suitable exemplary salts include potassium bicarbonate or potassium tetraborate-tetrahydrate. In one embodiment, the second composition is thus maintained at a pH between about 4 and about 6.

The second composition may further include at least one corrosion inhibitor to prevent corrosion of the conductive material in the features. In one embodiment, the corrosion inhibitors may be various organic compounds containing an azole group, such as mercaptobenzotriazole, 5-methyl-1-benzotriazole, benzotriazole (BTA), and combinations thereof, present at a concentration of about 2 wt. % or less such as a concentration of between about 0.02 wt. % and about 0.4 wt. %.

The second composition described herein may remove barrier residues, a very small portion of the dielectric materials, and at least some portion of cap materials, hard masks, and/or anti-reflective coating materials on top of the dielectric materials non-selectively at a removal rate ratio of, e.g., the copper-containing material to tantalum-containing material of between about 0.2:1 and about 2:1

Chemical Mechanical Polishing (CMP) Apparatus

A CMP system whether including a stationary, rotable, or linear platen may be utilized to practice the methods described herein. For simplicity and ease of description, however, the invention will be further described with reference to a Reflexion® CMP System, available from Applied Materials, Inc., of Santa Clara, Calif.

Figure 2:
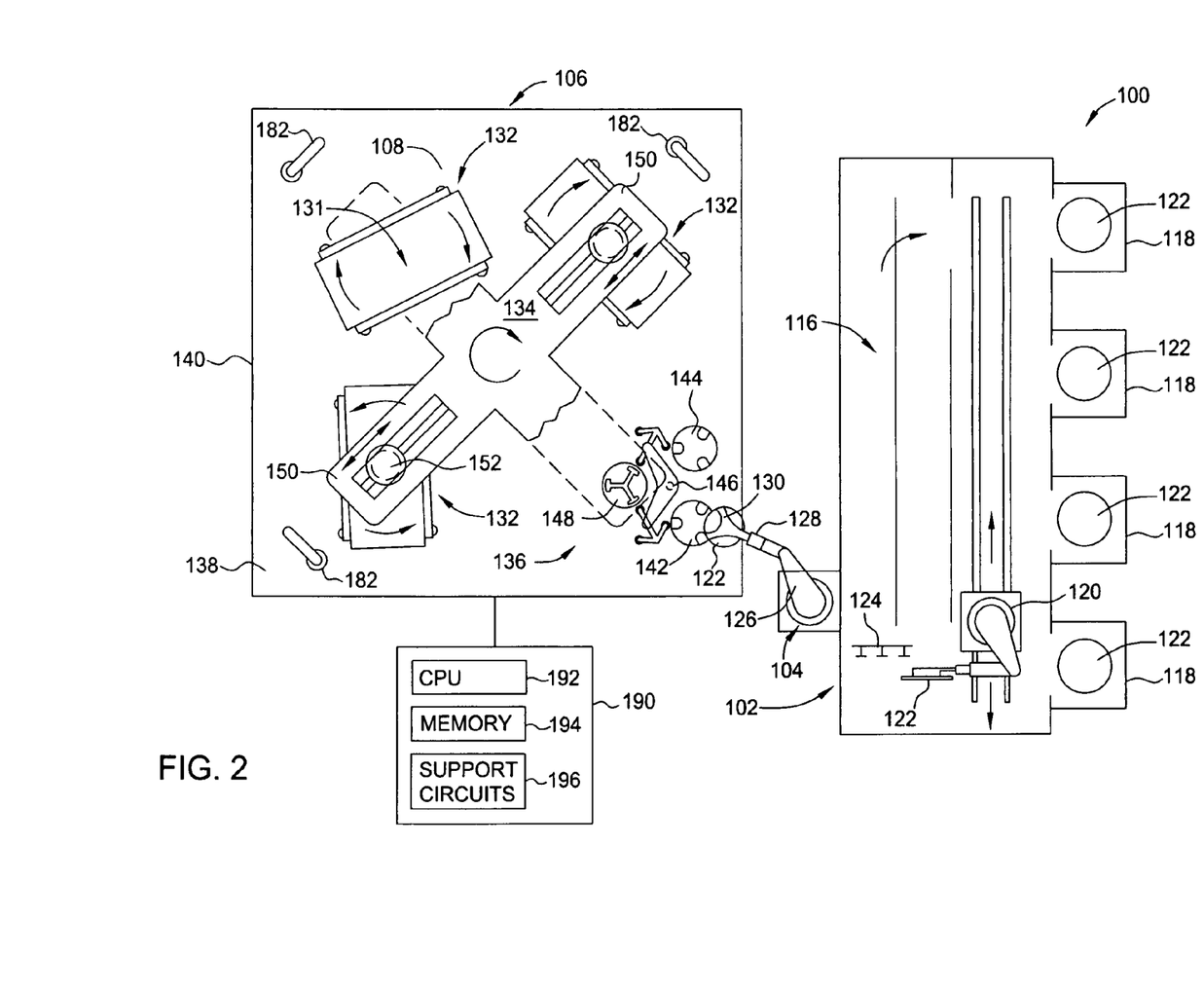
FIG. 2 is a schematic perspective view of an exemplary CMP apparatus.

FIG. 2 illustrates a perspective view of the Reflexion® CMP System 100. Generally, the system 100 includes a factory interface 102, a loading robot 104, one or more polishing modules 106, and one or more lift assemblies 108. The loading robot 104 is disposed proximate the factory interface 102 and the polishing module 106 to facilitate the transfer of substrates 122 therebetween.

The polishing module 106 may be a Mirra® Chemical Mechanical Polisher, available from Applied Materials, Inc. Other polishing modules 106 including those having polishing media, polishing webs, and combinations thereof may also be used. The polishing module 106 includes a plurality of polishing stations 132, a carousel 134 disposed on an upper or first side 138 of a machine base 140, and a transfer station 136. The polishing module 106 also includes a conditioning device 182 disposed on the base 140 adjacent each polishing station 132. The conditioning device 182 periodically conditions polishing surfaces 131 of the polishing stations 132 to maintain uniform polishing results.

At each polishing station 132, a polishing media or a polishing pad, such as a rectangular web of polishing material or a round polishing surface is disposed on each polishing surface 131 between a polishing head assembly 152 and the polishing station 132. The web of polishing material may include abrasive sheet polishing media containing abrasive particles. The web of polishing material may also be conventional polishing media made of polyurethane without containing abrasive particles. The polishing materials are typically disposed on binders or subpads, which act as backing supports. Subpads used with conventional material are generally lower in hardness (i.e., softer) than the subpads typically used with abrasive sheet webs.

The web of polishing material may have a smooth surface, a textured surface, a surface containing an abrasive in a binder material, or a combination thereof. The web of polishing material may be in the form of a roll or sheet (e.g., pad) of material that may be advanced across or releasably fixed to the polishing surface by a polishing material retention system that utilizes adhesives, vacuum, mechanical clamps, bonding, electrostatic chucks, or other retention mechanism.

A polishing pad typically has a durable roughened surface composed of microporous polyurethane foam, polyurethane foam mixed with filler, polyurethane impregnated felts, or other materials with special properties. Important pad properties are porosity, compressibility, and hardness. Polishing pad or the web of polishing material may be embossed or stamped with a pattern to improve distribution of a polishing composition across the substrate surface and may include a soft polishing material, a hard polishing material, or combinations thereof.

A soft polishing material or a high compressibility pad is broadly described herein as a polishing material having a polishing surface of a hardness of less than about 50 on the Shore D Hardness scale for polymeric materials as described and measured by the American Society for Testing and Materials (ASTM), headquartered in Philadelphia, Pa., and a hard polishing material or a low compressibility pad has a Shore D hardness of about 50 or greater.

The soft polishing pad may be composed of a napped poromeric synthetic material, such as a uniformly compressible material including a polymeric material, i.e., plastic, and/or foam, felt, rubber, or a combination thereof. An example of a soft polishing material is polyurethane impregnated with felt. A soft polishing pad is available as the Politex or Suba series, e.g., Suba IV, available from Rodel, Inc. Politex and Suba are tradenames of Rodel Inc. The inventors have discovered that soft polishing pads having the hardness described herein, such as a Politex pad, are compatible with the low pressure-high speed polishing process described above. According to the Preston equation, polishing at low pressure require high velocity or high platen speed. However, when polishing at low pressure and high velocity, the removal rate is considerably low or close to zero. Therefore, this can be partially overcome, in one aspect of the invention, by careful selection of polishing pads as described herein. Alternatively, the polishing pad may be a two-layer pad, which has an overall Shore D hardness of less than about 50 and shows no hydroplaning effect.

The polishing station 132 generally includes a polishing platen that is disposed on a base. The polishing platen is typically made of aluminum and is supported above the base by a bearing so that the polishing platen may rotate in relation to the base. The polishing platen has a top portion that supports the web of polishing material. The top portion may optionally include a plurality of passages coupled to a fluid source. Fluid flowing through the passages may be used to control the temperature of the polishing platen and the polishing material disposed thereon.

In one embodiment, the polishing head is a TITAN HEAD™ substrate carrier manufactured by Applied Materials, Inc., Santa Clara, Calif. Generally, the polishing head includes a housing having an extending lip that defines a center recess in which a bladder is disposed. The bladder may be made of an elastomeric material or thermoplastic elastomer such as ethylene propylene, silicone and HYTREL™. The bladder is coupled to a fluid source such that the bladder may be controllably inflated or deflated. The bladder, when in contact with the substrate, retains the substrate within the polishing head by deflating and thus creates a vacuum between the substrate and the bladder. A retaining ring circumscribes the polishing head to retain the substrate within the polishing head while polishing.

To facilitate control of the CMP system as described herein, a controller 190 may be used. The controller 190 may include a CPU 192, a memory 194, and a support circuit 196. The CPU 192 may be one of any form of computer processors that can be used in an industrial setting for controlling various chambers and sub-processors. The memory 194 is coupled to the CPU 192. A process, such as the polishing processes described below, is generally stored in the memory 194, typically as a software routine. The software routine may also be stored and/or executed by a second CPU (not shown) that is remotely located from the hardware being controlled by the CPU 192.

Although the process of the invention is discussed as being implemented as a software routine, some or all of the processing steps may be performed in hardware as well as by the software controller. As such, the invention may be implemented in software as executed upon a computer system, in hardware as an application specific integrated circuit or other type of hardware implementation, or a combination of software and hardware.

Chemical Mechanical Polishing (CMP) Process

FIGS. 3A–3H are a series of schematic cross-sections of a wafer illustrating sequential steps of a process for forming an in-laid metallization pattern, which use the planarization process described herein. The wafer includes, e.g., a dielectric layer with a dense array of feature definitions formed therein, a barrier layer deposited on top of the dielectric layer and in the feature definitions formed therein, and a copper layer deposited on top of the barrier layer and filling the feature definitions formed therein.

Figure 3A:
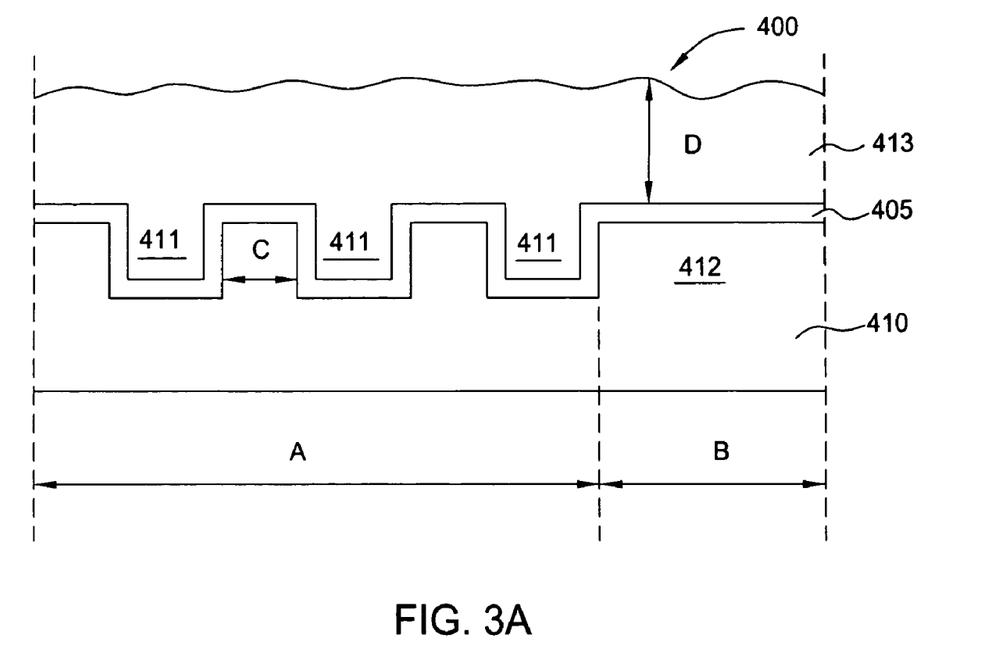
FIGS. 3A–3H are schematic diagrams illustrating one embodiment of a process for planarizing a substrate surface described herein.

FIG. 3A is a schematic cross-sectional view of an example of a wafer that requires planarization. The wafer includes a dielectric layer 410. A plurality of openings 411, such as vias, trenches, or holes, are patterned and etched into the dielectric layer 410 in area A to form feature definitions for a dense array of conductive lines, with area B being unetched or having a low density of feature definitions. The openings 411 are spaced apart by a distance C that may be any distance. The openings 411 may be formed in the dielectric layer 410 by conventional photolithographic and etching techniques. A barrier layer 405 of a conductive material, such as tantalum or a tantalum-containing material for copper metalization, is deposited in conformation in openings 411 and on the field 412 of the substrate, the upper surface of the dielectric layer 410. A conductive material layer 413, such as a copper layer, is disposed on top of the barrier layer at a thickness (D) between about 8,000 Å and about 18,000 Å.

The wafer in FIG. 3A is exposed to a CMP process employing a polishing composition to remove the conductive material layer 413 selectively with respect to the tantalum-containing barrier layer 405. If necessary, some over polishing may be performed during bulk removal to ensure complete removal of the conductive material layer 413.

Figure 3B:
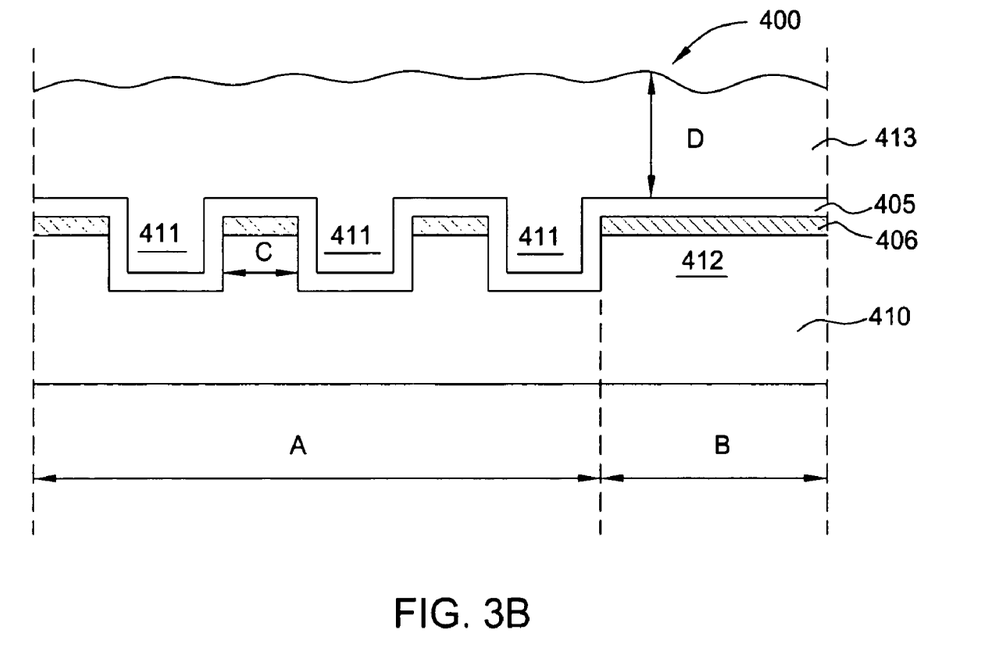

FIG. 3B is a schematic view of an example of one type of feature formed on a wafer requiring planarization. The wafer in FIG. 3B includes a protective layer 406 deposited on top of the dielectric layer 410, especially when the underlying dielectric layer 410 is a low-k dielectric layer. The protective layer 406 may include one layer of cap materials, hard mask, and/or anti-reflective coating materials alone, or multiple layers of the above materials, or in combination, depending on the requirement of the fabrication process. Typically, the protective layer 406 is at a thickness of about 100 Å to about 800 Å, which is a bit thicker than a typical barrier layer 405.

Figure 3C:
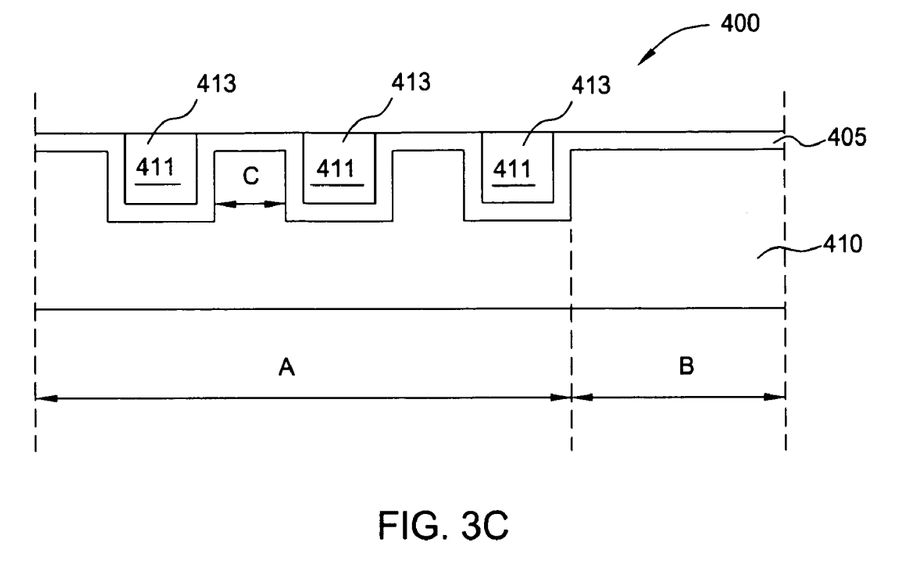
Figure 3D:
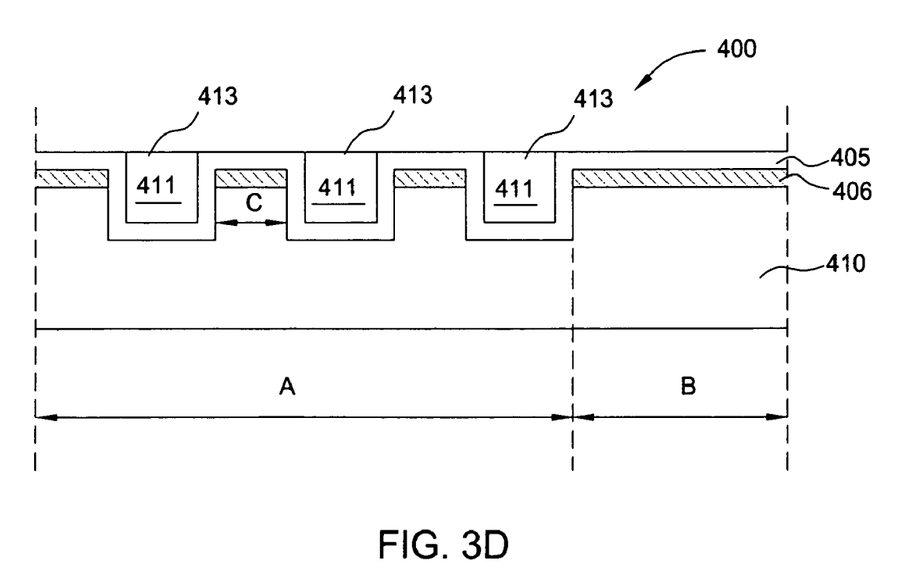

The barrier layer 405, such as a tantalum layer, is removed above the underlying dielectric layer 410 as shown in FIG. 3C and FIG. 3D. A first composition for selective removal of a bulk portion of the barrier layer from a substrate surface is applied to remove the barrier layer 405. A barrier removal polishing composition is applied to remove the barrier layer at a rate of at least about 250 Å/min, and generally at a rate of at least about 750 Å/min, from the dense array of features A and the field of the substrate B. FIG. 3C shows a wafer with a barrier layer 405, whereas FIG. 3D shows a wafer with a barrier layer 405 and a protective layer 406, on top of the dielectric layer 410. The dielectric layer 410 may include a low-k dielectric layer.

Figure 3E:
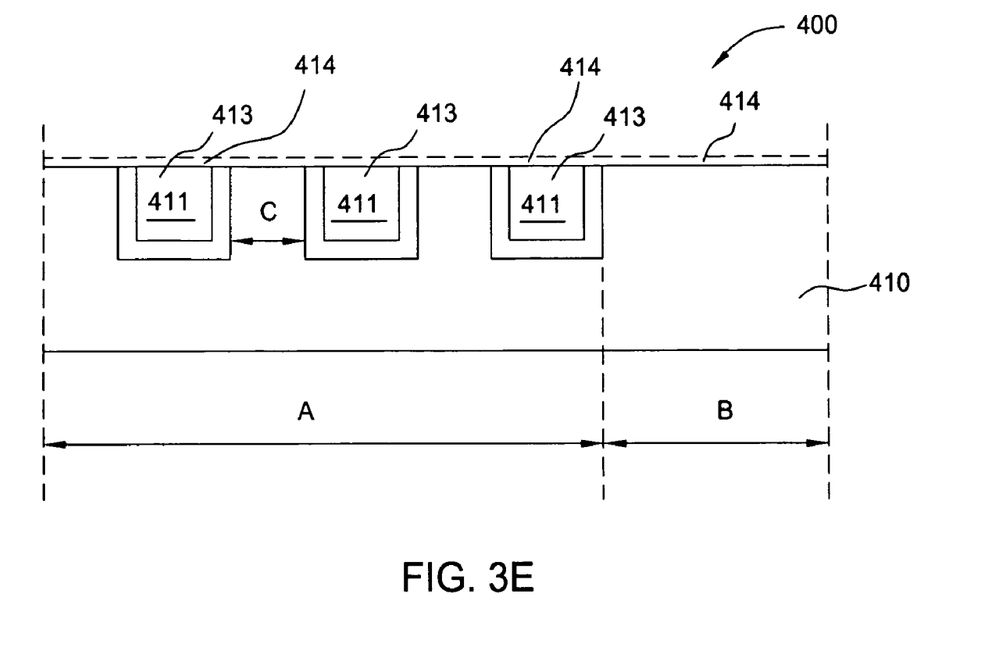
Figure 3F:
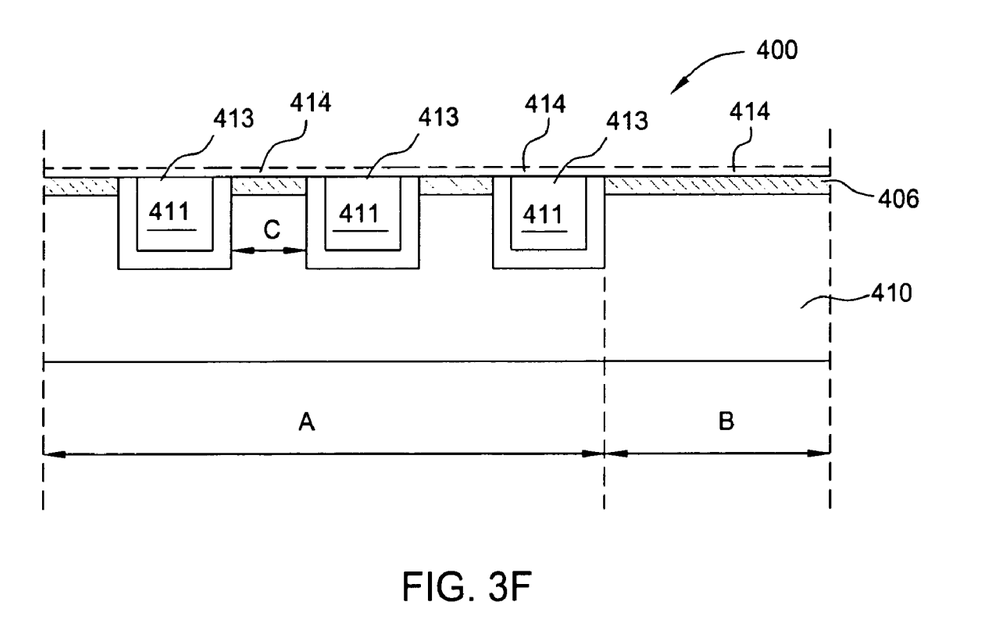

Referring to FIGS. 3E and 3F, any material remaining from the polishing process in FIG. 3C and FIG. 3D is present as residue 414 as illustrated by the dashed line or small islands on top of the dielectric layer 410. FIG. 3F includes the additional protective layer 406. A second composition for non-selective removal of any residual portion of the barrier layer, a small portion of the dielectric layer 410, as well as at least some portion of cap materials, hard masks, and/or anti-reflective coating layer 406 on top of the dielectric layer, is then applied to remove the residue 414.

Figure 3G:
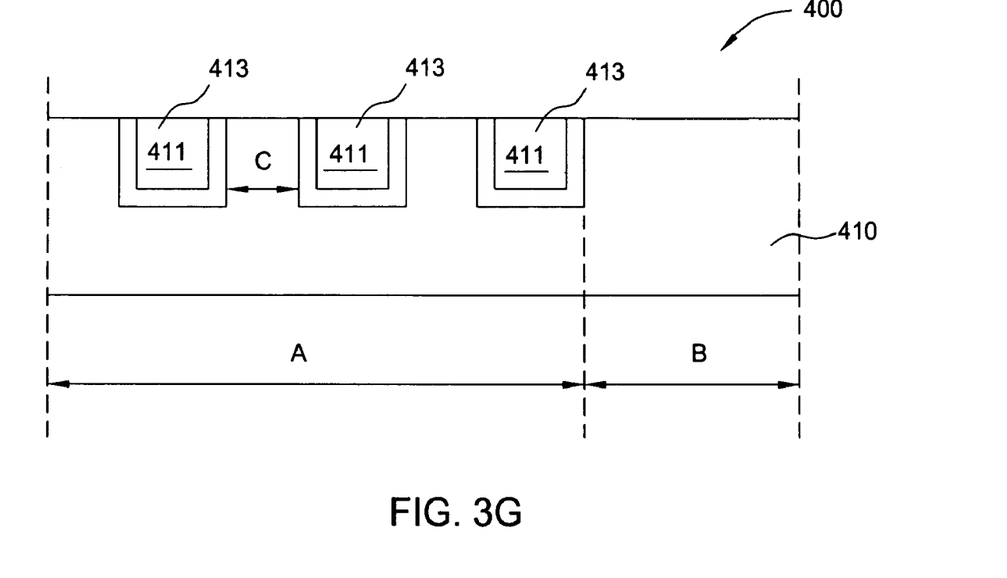
Figure 3H:
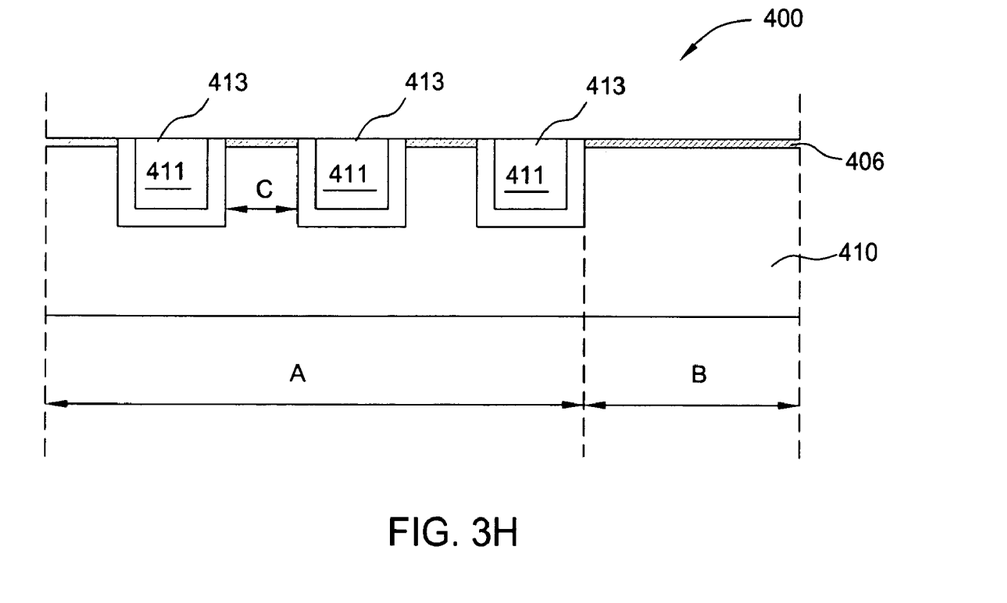

In FIG. 3G, barrier materials, such as tantalum or tantalum nitride, as well as any cap material, hard mask, and/or anti-reflective coating material are removed above the underlying dielectric layer 410, thereby planarizing the wafer surface. In FIG. 3H, bulk portion of the barrier material, residual barrier material, and some portion of the protective layer 406 are removed above the underlying dielectric layer 410 to obtain a planarized wafer surface, and a small portion of the protective layer 406 is left to protect the underlying dielectric layer 410. The concentration of the abrasive particles in the second polishing composition may be employed to control the amount of the protective layer 406 to be removed, thereby control the metal loss and dielectric erosion.

EXAMPLES

One example of features to be polished according to aspects of the invention described herein is as follows. A substrate having a low-k dielectric layer, such as Black Diamond™ from Applied Materials, Inc., of Santa Clara, Calif., with feature definitions formed therein, a tantalum or tantalum nitride barrier layer deposited on top of the dielectric layer and in the feature definitions formed therein, and a copper-containing layer deposited on the barrier layer and filling the feature definitions formed therein is provided to the polishing apparatus.

One example of the barrier removal process includes positioning a substrate on an appropriate polishing pad, such as a Politex pad available from Rodel, Inc., disposed on a web polishing platen in a Reflexion® CMP System available from Applied Materials, Inc. A first polishing composition for barrier materials is delivered to the polishing pad to remove the barrier materials and planarize the substrate surface. The first polishing composition including about 0.2 wt. % oxalic acid, between about 0.15 wt. % and about 2 wt. % of hydroxylamine, about 0.2 wt. % of BTA, about 1 wt. % of silica abrasive particles, deionized water, and a pH of about 6, is delivered to the polishing pad at a flow rate of about 200 ml/min. The pressure between the substrate and the polishing pad is about 0.5 psi and the polishing pad and the substrate are rotated relative to one another at a rate of about 600 rpm for a 20 inch platen, such as an average platen surface speed of about 780 cps. Alternatively, the substrate is polished at about 0.8 psi and at a platen speed of about 300 rpm (an average platen surface speed of about 390 cps). The substrate is then polished for about 60 seconds or a requisite amount of time sufficient to remove substantially most of the barrier materials to the dielectric materials.

The web polishing platen is then rotated at a speed of about 142 cps (about 109 rpm), the carrier head is rotated at a speed of about 87 rpm, and a polishing pressure of about 0.5 psi is applied between the substrate and the polishing pad while a second polishing composition comprising SS-12 from Cabot Microelectronics inc., of Chicago, Ill., with an additional corrosion inhibitor of 0.04% BTA is delivered continuously at a flow rate of about 200 ml/min. Depending on the amount of barrier residues, the amount of cap materials, hard masks, and/or anti-reflective coating materials required to be removed, other polishing compositions, such as SS-4 and SS-8, containing lower concentration of abrasive particles in the presence of about 0.1% to about 0.2% of BTA, such as about 0.04% of BTA, can be used as the second composition. The substrate is then polished for about 20 seconds for a light oxide buff at a rate up to about 300 Å/minute to sufficiently remove any remaining bulk barrier material, residual barrier material, as well as any cap material, hard mask, and/or anti-reflective coating materials, deposited either alone or in combination on top of the underlying dielectric layer. An Electra Clean™ solution is then used to clean the substrate surface.

In an alternative multi-step polishing process, the substrate is positioned over a Politex polishing pad, and the first low abrasive polishing composition described above is delivered to the polishing pad at a flow rate of about 200 ml/min. A pressure of about 0.5 psi is applied between the substrate and the polishing pad, and the polishing temperature is increased to about 70° C. by raising the temperature of the platen or the slurry used. The web polishing platen in a Reflexion® CMP system is rotated at a platen speed of about 260 cps (about 200 rpm). The substrate is polished for about 60 seconds at a rate of about 500 Å/minute to remove the bulk barrier materials. The platen is then rotated at a speed of about 120 cps (about 93 rpm) and at a polishing pressure of about 0.8 psi. The carrier head is rotated at a speed of about 87 rpm while a second polishing composition of SS-12 in the presence of 0.04% BTA is delivered at a flow rate of 200 ml/min to remove any remaining bulk barrier material, residual barrier material, and at least some portion of the protective materials on top of the dielectric layer. The substrate is then polished for 20 seconds or a requisite amount of time at a rate up to about 300 Å/min to provide short oxide buffing. An Electra Clean™ solution is then used.

While the foregoing is directed to embodiments of the invention, other and further embodiments of the invention may be devised without departing from the basic scope thereof, and the scope thereof is determined by the claims that follow.

What is claimed is:

1. A method of polishing a substrate having a dielectric material with a dielectric constant of 3.5 or less disposed thereon, at least one opening in the dielectric material, a barrier material disposed over the dielectric material, and a metal conductive material disposed over the barrier material, comprising:
   providing the substrate to an apparatus having at least one polishing platen;
   polishing the metal conductive material layer to expose the barrier material;
   polishing the barrier material at a polishing pressure between about 0.1 and about 2 psi, wherein polishing the barrier material further comprises:
      applying a first polishing composition to a first polishing pad on a first polishing platen;
      polishing the barrier material by a first polishing technique, wherein polishing the barrier material by the first polishing technique substantially removes the bulk portion of the barrier material at a removal rate of about 200 Å/min or higher and the selectivity of the first polishing composition is at a removal rate ratio of barrier material to metal conductive material to dielectric material of about 5:1:1 or higher;
      applying a second polishing composition to a second polishing pad on a second polishing platen; and
      polishing the barrier material by a second chemical mechanical polishing technique.

2. The method of claim 1, wherein polishing the barrier material by the second chemical mechanical polishing technique further comprises polishing at least a portion of the dielectric material in one or more polishing steps.

3. The method of claim 1, wherein polishing the barrier material by the second chemical mechanical polishing technique further comprises polishing, in one or more polishing steps, at least a portion of a protective material selected from the group consisting of cap material, hard mask, anti-reflective coating material, and combinations thereof, deposited either alone or in combination between the dielectric material and the barrier material.

4. The method of claim 1, wherein polishing the barrier material at the polishing pressure between about 0.1 and about 2 psi further comprises a platen speed of about 195 cps or higher.

5. The method of claim 1, wherein polishing the barrier material at the polishing pressure between about 0.1 and about 2 psi further comprises a polishing temperature of about 55° C. or higher.

6. The method of claim 1, wherein polishing the barrier material by the first polishing technique comprises polishing at a polishing pressure between about 0.1 and about 2 psi and a first platen speed of about 65 cps or higher.

7. The method of claim 6, wherein the first platen speed is about 195 cps or higher.

8. The method of claim 1, wherein polishing the barrier material by the second polishing technique comprises polishing at a polishing pressure between about 0.1 and about 2 psi and at a second platen speed of about 65 cps or greater.

9. The method of claim 1, wherein the at least one polishing platen comprises one or more chemical mechanical polishing platens.

10. The method of claim 1, wherein polishing the barrier material by the second polishing composition in the second chemical mechanical polishing technique provides a buffing of the dielectric material and removes any residual barrier material at a removal rate of about 200 Å/min or higher and a removal rate ratio of barrier material to metal conductive material to dielectric material between about 1:1:1 and about 1:1:10.

11. A method for polishing a wafer having a dielectric material, a barrier material, and a metal conductive material, comprising:
- polishing the wafer in the presence of a first composition applied to a first polishing pad to remove the barrier material, wherein the first composition further comprises:
  - up to about 2 wt. % of at least one reducing agent selected from the group consisting of bicarboxylic acids, tricarboxylic acids, and combinations thereof;
  - up to about 2 wt. % of at least one reducing agent selected from the group consisting of glucose, hydroxylamine, and combinations thereof;
  - up to about 1 wt. % of corrosion inhibitors;
  - up to about 10 wt. % of abrasive particles;
  - deionized water; and
  - a pH of about 7 or less; and
- polishing the wafer in the presence of a second composition applied to a second polishing pad to remove any residual barrier material, wherein the second composition further comprises:
  - up to about 30 wt. % of abrasive particles;
  - up to about 1 wt. % of corrosion inhibitors;
  - at least one pH buffering agent;
  - deionized water; and
  - a pH of about 3–12.

12. The method of claim 11, wherein polishing the wafer in the presence of the second composition further removes at least a portion of the dielectric material in one or more polishing steps.

13. The method of claim 11, wherein polishing the wafer in the presence of the second composition further removes, in one or more polishing steps, at least a portion of a protective material selected from the group consisting of cap material, hard mask, anti-reflective coating material, and combinations thereof, deposited either alone or in combination on top of the dielectric material.

14. The method of claim 11, wherein the dielectric constant of the dielectric material is about 3.5 or less.

15. The method of claim 11, wherein the first composition comprises about 0.2 wt. % oxalic acid, about 0.2 wt. % hydroxylamine, about 0.2 wt. % corrosion inhibitor, about 1 wt. % abrasive particles, deionized water, and a pH of about 6.

16. The method of claim 11, wherein the first composition removes the bulk portion of the barrier material selectively from the substrate at a removal rate of about 200 Å/min or higher and a removal rate ratio of barrier material to metal conductive material to dielectric material of about 5:1:1 or higher.

17. The method of claim 11, wherein polishing the wafer further comprises a first polishing pressure between about 0.1 psi and about 2 psi.

18. The method of claim 11, wherein polishing the wafer further comprises a first average platen speed of about 195 cps or higher.

19. The method of claim 11, wherein polishing the wafer further comprises a first polishing temperature of about 55° C. or higher.

20. The method of claim 11, wherein polishing the wafer further comprises a second polishing pressure between about 0.1 psi and about 2 psi.

21. The method of claim 11, wherein polishing the wafer further comprises a second average platen speed of about 65 cps or higher.

22. The method of claim 11, wherein polishing the wafer further comprises a second polishing temperature of about 55° C. or higher.

23. The method of claim 11, wherein the second polishing composition provides a light buffing of the dielectric material and removes any residual barrier material at a removal rate of about 200 Å/min or higher and a removal rate ratio of barrier material to metal conductive material to dielectric material between about 1:1:1 and about 1:1:10.

24. A method for polishing a material from a substrate, comprising:
- polishing the substrate in the presence of a composition at a polishing pressure between about 0.1 psi and 2 psi or less, wherein the composition comprises:
  - up to about 2 wt. % of least one reducing agent selected from the group consisting of bicarboxylic acids, tricarboxylic acids, and combinations thereof;
  - up to about 2 wt. % of at least one reducing agent selected from the group consisting of glucose, hydroxylamine, and combinations thereof;
  - up to about 2 wt. % of corrosion inhibitors;
  - up to about 10 wt. % of abrasive particles;
  - deionized water; and
  - a pH of about 7 or less.

* * * * *

UNITED STATES PATENT AND TRADEMARK OFFICE
CERTIFICATE OF CORRECTION

| | | |
|---|---|---|
| PATENT NO. | : 7,104,869 B2 | Page 1 of 1 |
| APPLICATION NO. | : 10/187857 | |
| DATED | : September 12, 2006 | |
| INVENTOR(S) | : Tsai et al. | |

It is certified that error appears in the above-identified patent and that said Letters Patent is hereby corrected as shown below:

Column 5, Line 39: Change "necessary" to --necessarily--

Column 13, Line 30: Insert a period after "2:1"

Column 17, Line 17: Change "inc." to --Inc.--

Column 20, Claim 24, Line 35: Before "least", insert --at--

Signed and Sealed this

Fifteenth Day of May, 2007

JON W. DUDAS
*Director of the United States Patent and Trademark Office*